United States Patent
Hu (10) Patent No.: US 12,071,028 B2
(45) Date of Patent: Aug. 27, 2024

(54) INSULATION DETECTION METHOD AND APPARATUS FOR FUEL CELL VEHICLE, AND VEHICLE

(71) Applicant: GREAT WALL MOTOR COMPANY LIMITED, Baoding (CN)

(72) Inventor: Zhimin Hu, Baoding (CN)

(73) Assignee: GREAT WALL MOTOR COMPANY LIMITED, Baoding (CN)

( * ) Notice: Subject to any disclaimer, the term of this patent is extended or adjusted under 35 U.S.C. 154(b) by 237 days.

(21) Appl. No.: 17/758,211

(22) PCT Filed: Apr. 1, 2021

(86) PCT No.: PCT/CN2021/084987
§ 371 (c)(1),
(2) Date: Jun. 29, 2022

(87) PCT Pub. No.: WO2021/197436
PCT Pub. Date: Oct. 7, 2021

(65) Prior Publication Data
US 2023/0037313 A1  Feb. 9, 2023

(30) Foreign Application Priority Data

Apr. 2, 2020   (CN) .......................... 202010255835.7

(51) Int. Cl.
*B60L 3/00*    (2019.01)
*G01R 31/12*   (2020.01)

(52) U.S. Cl.
CPC .......... *B60L 3/0053* (2013.01); *B60L 3/0069* (2013.01); *G01R 31/1227* (2013.01)

(58) Field of Classification Search
CPC ........ B60L 3/0053; B60L 3/0069; B60L 3/04; B60L 50/15; B60L 50/75; B60L 58/27;
(Continued)

(56) References Cited

U.S. PATENT DOCUMENTS 10,720,658 B2 *  7/2020  Fujioka ............ H01M 8/04686
2021/0362624 A1 * 11/2021  Breu ................. H01M 8/04313
(Continued)

FOREIGN PATENT DOCUMENTS

| CN | 103605056 | 2/2014 |
| CN | 104192018 | 12/2014 |

(Continued)

OTHER PUBLICATIONS

Translation of CN 107817431 A (Year: 2018).*
(Continued)

*Primary Examiner* — Russell Frejd
(74) *Attorney, Agent, or Firm* — Hodgson Russ LLP (57) ABSTRACT

Provided are an insulation detection method and apparatus for a fuel cell vehicle, and a vehicle. The method comprises: determining whether a vehicle is started; when the vehicle is started, executing the following steps: controlling a battery management system to perform the first insulation detection; detecting whether a fuel cell is started; and when the fuel cell is not started, controlling a fuel cell control unit to perform second insulation detection, wherein an insulation detection module for performing insulation detection on the fuel cell is provided in the fuel cell control unit of the vehicle.

14 Claims, 4 Drawing Sheets

(58) Field of Classification Search
CPC .......... B60L 58/26; B60L 58/30; B60L 58/40; B60L 2250/10; G01R 31/1227; G01R 31/36; G01R 31/007; G01R 27/025; Y02E 60/50; Y02T 90/40
See application file for complete search history.

(56) References Cited

U.S. PATENT DOCUMENTS

| | | | | |
|---|---|---|---|---|
| 2022/0221500 | A1* | 7/2022 | Park | G01R 31/1227 |
| 2022/0268821 | A1* | 8/2022 | Sun | G01R 27/025 |
| 2022/0278414 | A1* | 9/2022 | Römelsberger | H01M 50/296 |
| 2022/0388406 | A1* | 12/2022 | Ruf | B60L 50/75 |
| 2022/0402363 | A1* | 12/2022 | Sun | H01M 8/04955 |

FOREIGN PATENT DOCUMENTS

| | | |
|---|---|---|
| CN | 105313699 | 2/2016 |
| CN | 107490766 | 12/2017 |
| CN | 107817431 | 3/2018 |
| CN | 108390084 | 8/2018 |
| CN | 108725204 | 11/2018 |
| CN | 109212385 | 1/2019 |
| CN | 109562698 | 4/2019 |
| CN | 109606203 | 4/2019 |
| CN | 109895660 | 6/2019 |
| CN | 110053492 | 7/2019 |
| CN | 110315980 | 10/2019 |
| CN | 110875484 | 3/2020 |
| CN | 110943241 | 3/2020 |
| DE | 102018205165 | 10/2019 |
| DE | 102019117486 | 2/2020 |
| JP | 2013072751 | 4/2013 |
| KR | 20190123985 | 11/2019 |
| WO | 2019192802 | 10/2019 |

OTHER PUBLICATIONS

CNIPA, First Office Action for CN Application No. 202010255835.7, Mar. 17, 2022.
WIPO, International Search Report for PCT/CN2021/084987, Jun. 29, 2021.

* cited by examiner

INSULATION DETECTION METHOD AND APPARATUS FOR FUEL CELL VEHICLE, AND VEHICLE

CROSS-REFERENCE TO RELATED APPLICATIONS

The present application is a U.S. national stage entry of International Application No. PCT/CN2021/084987, filed Apr. 1, 2021, which claims priority to Chinese Patent Application No. 202010255835.7, filed Apr. 2, 2020, the entire disclosures of which are incorporated herein in its entirety by reference.

TECHNICAL FIELD

The present disclosure relates to the technical field of vehicles, and more particularly, to an insulation detection method and apparatus for a fuel cell vehicle, and a vehicle.

BACKGROUND

Fuel cell automobiles are driven by a chemical reaction that converts hydrogen energy into electrical energy, and the voltage of battery packs thereof far exceeds the safe voltage that the human body can withstand. During the daily use of the automobile, the aging or the penetration of moisture of the high-voltage cable may cause the insulation resistance between the positive and negative leads of the power battery and the automobile chassis to decrease, resulting in electrical leakage, thereby seriously endangering the personal safety of the personnel in the automobile. In order to ensure the electrical safety of the entire vehicle, reasonable insulation detection in fuel cell automobiles is the key to ensure the safety of the personnel in the automobile.

SUMMARY

In view of this, the present disclosure is aimed at providing an insulation detection method for a fuel cell vehicle for achieving a reasonable insulation detection for a fuel cell automobile.

In order to achieve the above object, the technical solutions of the present disclosure are achieved as follows. An insulation detection method for a fuel cell vehicle is provided. The insulation detection method for a fuel cell vehicle includes: determining whether a vehicle is started; and when the vehicle is started, performing the following steps: controlling a battery management system to perform a first insulation detection, wherein the first insulation detection is an insulation detection performed on a high voltage network of an entire vehicle; detecting whether a fuel cell is started; and when the fuel cell is not started, controlling a fuel cell control unit to perform a second insulation detection, wherein the second insulation detection is an insulation detection performed on the fuel cell, and an insulation detection module for performing insulation detection on the fuel cell is provided in the fuel cell control unit of the vehicle.

Furthermore, the method further includes: when the fuel cell is started, keep performing the first insulation detection by the battery management system.

Furthermore, the method further includes: when the fuel cell is started, determining whether the fuel cell is deactivated; and controlling the fuel cell control unit to perform the second insulation detection when the fuel cell is deactivated.

Furthermore, the method further includes: when the fuel cell is not started, determining whether the fuel cell is started; and when the fuel cell is started, controlling the fuel cell control unit to stop performing the second insulation detection.

The insulation detection method for a fuel cell vehicle according to the present disclosure has the following advantages over the prior art.

An insulation detection module is provided in a battery management system. After a high voltage of the entire vehicle is established, the battery management system performs insulation detection on the high voltage network of the entire vehicle in real time. During the traveling of the fuel cell vehicle, the fuel cell may be in a non-started state, in which case the fuel cell is disconnected from the high voltage network of the entire vehicle and the insulation detection is performed by using only the battery management system such that an insulation fault inside the fuel cell will not be detected. For this reason, an insulation detection module for performing insulation detection on the fuel cell is provided in the fuel cell control unit. When the vehicle is started and the fuel cell is not started, both the battery management system and the fuel cell control unit are controlled to perform insulation detection, making it possible to effectively avoid a safety risk due to an insulation fault inside the fuel cell.

Another object of the present disclosure is to propose an insulation detecting apparatus for a fuel cell vehicle for achieving reasonable insulation detection for a fuel cell automobile.

In order to achieve the above object, the technical solutions of the present disclosure are achieved as below:

an insulation detecting apparatus for a fuel cell vehicle, wherein the insulation detecting apparatus for a fuel cell includes: a determination module for determining whether the vehicle is started; and a control module for performing the following steps when the vehicle is started: controlling a battery management system to perform a first insulation detection, wherein the first insulation detection is an insulation detection performed on a high voltage network of an entire vehicle; detecting whether a fuel cell is started; and when the fuel cell is not started, controlling a fuel cell control unit to perform a second insulation detection, wherein the second insulation detection is an insulation detection performed on the fuel cell, and an insulation detection module for performing insulation detection on the fuel cell is provided in the fuel cell control unit of the vehicle.

Furthermore, the control module is further configured for: when the fuel cell is started, keeping the battery management system performing the first insulation detection.

Furthermore, the control module is further configured for: when the fuel cell is started, determining whether the fuel cell is deactivated; and controlling the fuel cell control unit to perform the second insulation detection when the fuel cell is deactivated.

Further, when the vehicle is started, the control module is further configured for: when the fuel cell is not started, determining whether the fuel cell is started; and when the fuel cell is started, controlling the fuel cell control unit to stop performing the second insulation detection.

The insulation detecting apparatus for a fuel cell vehicle has the same advantages as the above-described insulation detection method for a fuel cell vehicle with respect to the prior art, and those will not be described in detail herein.

Accordingly, embodiments of the present disclosure also provide a vehicle including the above-described insulation detecting apparatus for a fuel cell vehicle.

Accordingly, embodiments of the present disclosure also provide a computer-readable storage medium having stored thereon instructions for causing a machine to perform the insulation detection method for a fuel cell vehicle according to the above.

Other features and advantages of the present disclosure will be described in detail in the preferred embodiments that follow.

The above description is only an overview of the technical solutions of the present disclosure. In order to understand the technical means of the present disclosure more clearly, the implementation can be made according to the contents of the description. In order to make the above and other purposes, features, and advantages of the present disclosure more obvious and easier to understand, preferred embodiments of the present disclosure are listed below.

BRIEF DESCRIPTION OF THE DRAWINGS

In order to explain the embodiments of the present disclosure or the technical solutions in the related art more clearly, a brief description will be given below with reference to the accompanying drawings which are used in the description of the embodiments or the related art; obviously, the drawings in the description below are some embodiments of the present disclosure, and for those of ordinary skills in the art, other drawings can also be obtained from these drawings without creative efforts.

The accompanying drawings constituting a part of the present disclosure are used to provide a further understanding of the present disclosure. The schematic implementation modes of the present disclosure and descriptions thereof are used to explain the present disclosure and do not constitute an improper limitation of the present disclosure. In the drawings.

DETAILED DESCRIPTION OF THE EMBODIMENTS

In order to make the purposes, technical solutions, and advantages of the embodiments of the present disclosure clearer, the technical solutions in the embodiments of the present disclosure will be clearly and completely described below with reference to the accompanying drawings in the embodiments of the present disclosure. Obviously, the described embodiments are some, but not all, of the embodiments of the present disclosure. Based on the embodiments in the present disclosure, all other embodiments obtained by a person of ordinary skills in the art without inventive efforts fall within the scope of the present disclosure.

It should be noted that implementation modes and features thereof in the present disclosure may be combined with each other without conflicts.

An insulation detection module is provided in a battery management system of a fuel cell vehicle. After a high voltage of the entire vehicle is established, the battery management system performs insulation detection on the high voltage network of the entire vehicle in real time. When it is detected that the insulation resistance value is lower than a threshold value, the entire vehicle controller performs a safety response in time.

Since the power response speed of the fuel cell is too slow to respond to the changing power demand of an automobile driver in time, most fuel cell automobiles currently adopt the parallel output mode of a fuel cell and a lithium battery. The fuel cell outputs at constant power. When the driver requests an output with a power greater than that of the fuel cell, the lithium battery is discharged, otherwise, the lithium battery is charged. When the driver power keeps the low power request for a long time and the electric capacity of the lithium battery is charged to a high threshold value, the fuel cell shuts down and is disconnected from the high voltage network, and the lithium battery outputs alone. The fuel cell is started again when the electric capacity decreases.

That is, the fuel cell may not be in a start-up state during the traveling of the fuel cell automobile. At this time, the fuel cell is disconnected from the high voltage network, and the battery management system cannot detect the insulation resistance value in the fuel cell region. Therefore, an insulation fault occurring inside the fuel cell is not detected when it is not started, resulting in a safety hazard.

Embodiments of the present disclosure provide an insulation detection method and apparatus for a fuel cell vehicle, and a vehicle, which can effectively solve the above technical problems and avoid a safety risk caused by undetected insulation fault inside a fuel cell. The present disclosure will now be described in detail in connection with the implementation modes with reference to the accompanying drawings.

Figure 1:
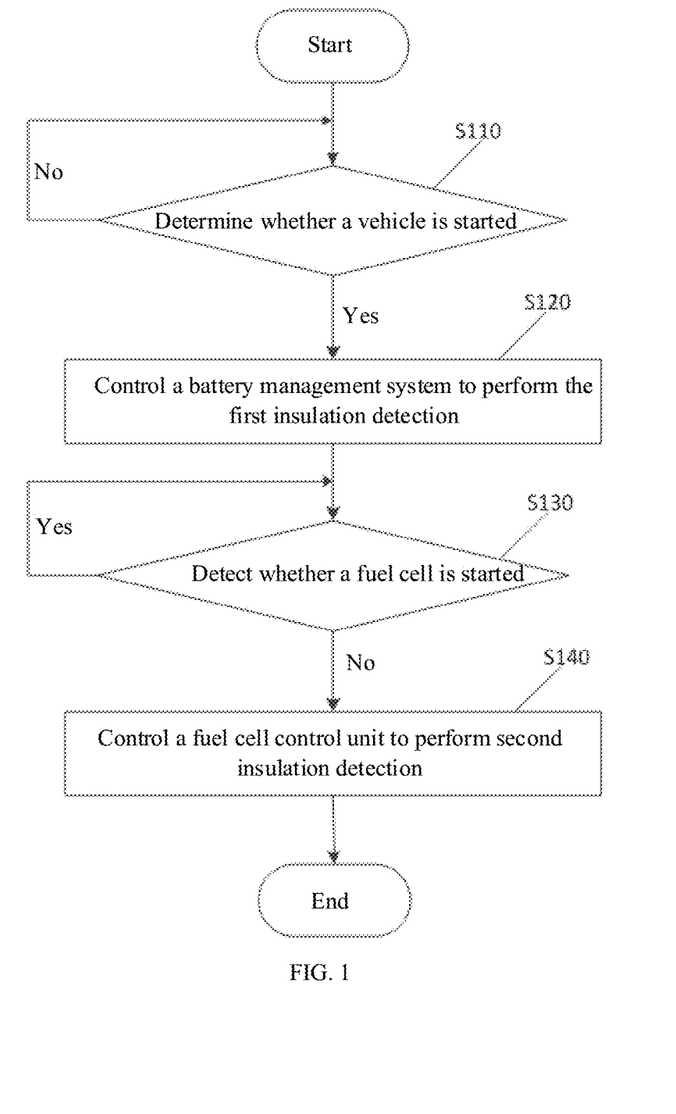
FIG. 1 shows a schematic flow diagram of an insulation detection method for a fuel cell vehicle according to an embodiment of the present disclosure.

FIG. 1 shows a schematic flow diagram of an insulation detection method for a fuel cell vehicle according to an embodiment of the present disclosure. As shown in FIG. 1, embodiments of the present disclosure provide an insulation detection method for a fuel cell vehicle, which may be performed, for example, by an entire vehicle controller. The method may include steps S110 to S140.

In step S110, it is determined whether a vehicle is started.

Upon the completion of the power-on of the vehicle, the entire vehicle controller can receive a signal indicating that the power-on is completed to indicate that the vehicle is started. The entire vehicle controller may determine whether the vehicle is started according to whether a signal that the power-on is completed is received. When the vehicle is started, the entire vehicle controller may execute steps S120 to S140.

In step S120, the battery management system is controlled to perform the first insulation detection.

The first insulation detection is an insulation detection performed on a high voltage network of the entire vehicle.

When the vehicle is started, the battery management system may be controlled to continuously perform the first insulation detection, and the entire vehicle controller may monitor an insulation resistance value detected by the battery management system in real time. If the insulation resistance value exceeds a threshold value, a corresponding insulation fault response may be performed, such as controlling the vehicle to perform deceleration driving, and performing a power-down operation when the vehicle speed is low, etc.

In step S130, it is detected whether a fuel cell is started.

The fuel cell may not be in a start-up state during the traveling of the fuel cell automobile, so it is necessary to detect whether the fuel cell is started in real time. Specifically, the fuel cell control unit may detect the state of the fuel cell in real time and output a state signal of the fuel cell to the entire vehicle controller, the state signal being capable of indicating whether the fuel cell is in a start-up state.

In step S140, when the fuel cell is not started, the fuel cell control unit is controlled to perform the second insulation detection.

The second insulation detection is an insulation detection performed on the fuel cell.

An insulation detection module for performing insulation detection on the fuel cell may be provided in the fuel cell control unit of the vehicle. The insulation detection module may be any conventional apparatus capable of performing insulation detection, and may be, for example, a balanced bridge detecting apparatus.

When the fuel cell is not started, the fuel cell is disconnected from the high voltage network, and the battery management system cannot detect the insulation resistance value in the region of the fuel cell. Therefore, by providing an insulation detection module for performing insulation detection on the fuel cell in the fuel cell control unit, it is possible to control the fuel cell control unit to perform the second insulation detection to obtain an insulation resistance value inside the fuel cell when the vehicle is started and the fuel cell is not started. When it is detected that the insulation resistance value inside the fuel cell exceeds the threshold value, a corresponding insulation fault response may be performed.

An insulation detection module for performing insulation detection on the fuel cell is provided in the fuel cell control unit. When the vehicle is started and the fuel cell is not started, both the battery management system and the fuel cell control unit are controlled to perform insulation detection, making it possible to effectively avoid a safety risk due to an insulation fault inside the fuel cell.

Figure 2:
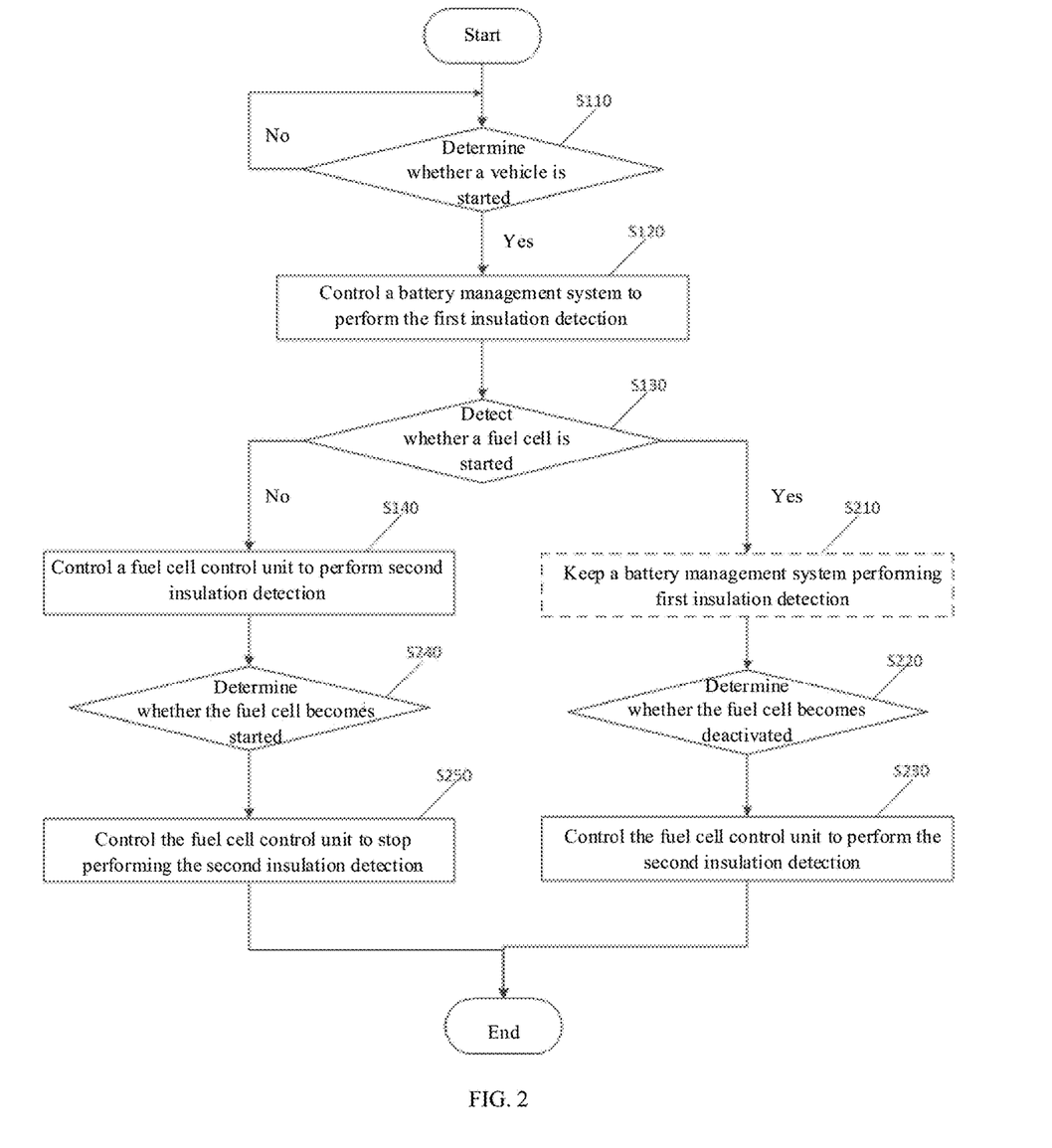
FIG. 2 shows a schematic flow diagram of an insulation detection method for a fuel cell vehicle according to yet another embodiment of the present disclosure.

FIG. 2 shows a schematic flow diagram of an insulation detection method for a fuel cell vehicle according to yet another embodiment of the present disclosure. As shown in FIG. 2, based on any of the foregoing embodiments, the insulation detection method for a fuel cell vehicle provided by an embodiment of the present disclosure may further include steps S210 to S250.

In step S210, when it is detected in step S130 that the fuel cell is started, the battery management system performing the first insulation detection is maintained. When the fuel cell is started, the fuel cell is accessed to the high voltage network of the entire vehicle, and the insulation resistance value inside the fuel cell can be detected by using the battery management system. In an alternative circumstance, step S210 may be omitted. When it is detected that the fuel cell is started, step S220 is directly performed.

In step S220, when the fuel cell is started, it is determined whether the fuel cell is deactivated.

The fuel cell control unit may detect the state of the fuel cell in real time and output a state signal of the fuel cell to the entire vehicle controller, the state signal being capable of indicating whether the fuel cell is in a start-up state. The entire vehicle controller may determine whether the fuel cell changes from the start-up state to the state that it is stopped from the start-up state according to the state signal of the fuel cell output from the fuel cell control unit.

In step S230, when the fuel cell is deactivated, the fuel cell control unit is controlled to perform the second insulation detection.

When the fuel cell is deactivated, the fuel cell is separated from the high voltage network of the entire vehicle, and the battery management system will no longer be able to detect the insulation resistance value inside the fuel cell. Therefore, the fuel cell unit should be controlled to perform the second insulation detection to obtain and monitor the insulation resistance value inside the fuel cell.

In step S240, when it is detected in step S130 that the fuel cell is not started, it may be determined whether the fuel cell is started.

For example, the fuel cell may be started when the electric capacity of the lithium battery is low. The entire vehicle controller may determine whether the fuel cell changes from the non-started state to the started state according to the state signal of the fuel cell output from the fuel cell control unit.

In step S250, when the fuel cell is started, the fuel cell control unit is controlled to stop performing the second insulation detection.

When the fuel cell is started, the fuel cell is accessed to the high voltage network of the entire vehicle, and the insulation resistance value inside the fuel cell can be detected by using the battery management system. Stopping the fuel cell unit from performing the second insulation detection can avoid the detection interference of the fuel cell unit with the battery management system.

The battery management system will stop performing the first insulation detection when the vehicle is deactivated, and the fuel cell control unit will also stop performing the second insulation detection when the fuel cell control unit performs the second insulation detection.

The insulation detection method for fuel cell vehicles provided by an embodiment of the present disclosure cooperates with the fuel cell control unit by the battery management system so that the insulation of all parts of the vehicle are monitored at any time during traveling, thereby effectively avoiding a safety hazard caused by the insulation fault inside the fuel cell not being detected.

In any embodiment of the present disclosure, the insulation fault responses performed for the first insulation detection and the second insulation detection may be the same. For example, the insulation fault responses performed for both the first insulation detection and the second insulation detection may be: controlling the vehicle to perform deceleration traveling and performing a power-down operation or the like when the vehicle speed is low. Alternatively, the insulation fault responses performed for the first insulation detection and the second insulation detection may be different.

For example, when the fuel cell is not started, the entire vehicle controller may read the first insulation resistance value detected by the fuel cell control unit and the second insulation resistance value detected by the battery management system.

If the first insulation resistance value is less than the first threshold value, it indicates that the vehicle is in an insulation fault, and such insulation fault is an insulation fault caused inside the fuel cell. In this case, a first control strategy may be performed. Specifically, when the first insulation resistance value is less than the first threshold value, it may continue to determine whether the first insulation resistance value is less than a third threshold value, the third threshold value being less than the first threshold value.

The first threshold value and the third threshold value may be set to any suitable values according to the actual situation.

If the first insulation resistance value is less than the first threshold value but not less than the third threshold value, it indicates that the current insulation fault condition is not severe. In this case, only a first prompt may be sent to alert the driver. The first prompt may be a light and/or voice prompt. For example, it can control the meter fuel cell fault light to illuminate yellow to prompt the driver, and/or control a voice player to play information about the insulation fault of the fuel cell, etc. to prompt the driver.

If the first insulation resistance value is less than the third threshold value, it indicates that the current insulation fault condition is relatively severe. In this case, one or more of the following three may be performed: sending a second prompt, prohibiting the start of the fuel cell, and controlling the vehicle speed based on the lithium battery electric capacity of the vehicle. Preferably, all three of the foregoing may be implemented to ensure the in-vehicle personnel safety.

The second prompt may be a light and/or voice prompt. For example, the instrument fuel cell fault light can be controlled to illuminate red to prompt the driver, and/or a voice player can be controlled to play information about the severe insulation fault of the fuel cell, etc. to prompt the driver.

When the fuel cell is not in the start-up state, if the insulation fault inside the fuel cell is relatively severe, the fuel cell may be prohibited from starting. For example, the entire vehicle controller may transmit a signal regarding the prohibition of starting the fuel cell to the fuel cell control unit, and the fuel cell control unit, in response to the signal, may control the fuel cell to be in a safe state to avoid the occurrence of a leakage phenomenon due to the starting of the fuel cell. Furthermore, the vehicle speed can be reasonably controlled based on the lithium battery electric capacity of the vehicle. For example, if the lithium battery electric capacity is greater than the threshold value of the electric capacity, the vehicle may be controlled to run at a vehicle speed requested by the driver. If the lithium battery electric capacity is not greater than the threshold value of the electric capacity, the vehicle may be controlled to decelerate or the vehicle speed of the vehicle may be controlled to not exceed a preset vehicle speed. An embodiment of the present disclosure does not limit how to reasonably control the vehicle speed according to the electric capacity of the lithium battery of the vehicle.

If the second insulation resistance value is less than the second threshold value, it indicates that the vehicle is in an insulation fault, and this insulation fault is an insulation fault caused by a portion of the entire vehicle other than the fuel cell. In this case, a second control strategy may be performed. The second control strategy is different from the first control strategy. Specifically, when the second insulation resistance value is less than the second threshold value, it may continue to determine whether the second insulation resistance value is less than a fourth threshold value, the fourth threshold value being less than the second threshold value. The second threshold value and the fourth threshold value may be set to any suitable value according to the actual situation. In an alternative, the first threshold value and the second threshold value may be the same and the third threshold value and the fourth threshold value may be the same in an embodiment of the present disclosure. The first threshold value, the second threshold value, the third threshold value, and the fourth threshold value may be set according to the requirements for the insulation resistance value of a fuel vehicle of the national standard.

If the second insulation resistance value is less than the second threshold value but not less than the fourth threshold value, it indicates that the current insulation fault is not severe. In this case, one or both of the following may be performed: sending a third prompt, and controlling the vehicle speed of the vehicle to be lower than the first preset vehicle speed. Preferably, both of the foregoing may be preferably performed to ensure the in-vehicle personnel safety.

The third prompt may be a light and/or voice prompt. For example, a fault light of an instrument power system may be controlled to illuminate yellow to prompt the driver, and/or a voice player may be controlled to play information about the insulation fault of the power system, etc. to prompt the driver. Further, the vehicle speed of the vehicle may be controlled to be lower than the first preset vehicle speed to ensure safe driving. Specifically, the current vehicle speed of the vehicle may be compared with the first preset vehicle speed. If the current vehicle speed is not less than the first preset vehicle speed, the vehicle may be controlled not to respond to the driving demand of the driver, but to decelerate until the vehicle speed is less than the first preset vehicle speed. If the current vehicle speed is less than the first preset vehicle speed, the vehicle can be controlled to run normally according to the driving demand of the driver.

If the second insulation resistance value is less than the fourth threshold value, it indicates that the current insulation fault is relatively severe. In this case, any one or more of the following three may be performed: sending a fourth prompt, controlling the vehicle speed of the vehicle to be lower than a second preset vehicle speed, and performing high voltage power-down if the vehicle speed of the vehicle is lower than a safety threshold value. Preferably, all three of the foregoing may be implemented to ensure the in-vehicle personnel safety.

The fourth prompt may be a light and/or voice prompt. For example, a fault light of an instrument power system may be controlled to illuminate red to prompt the driver, and/or a voice player may be controlled to play information about the severe insulation fault of the power system, etc. to prompt the driver.

Further, the vehicle speed of the vehicle may be controlled to be lower than the second preset vehicle speed to ensure safe driving. Specifically, the current vehicle speed of the vehicle may be compared with the second preset vehicle speed. If the current vehicle speed is not less than the second preset vehicle speed, the vehicle may be controlled not to respond to the driving demand of the driver, but to decelerate until the vehicle speed is less than the second preset vehicle speed. If the current vehicle speed is less than the second preset vehicle speed, the vehicle can be controlled to run normally according to the driving demand of the driver. In the embodiment of the present disclosure, the second preset vehicle speed is less than the first preset vehicle speed, and the first preset vehicle speed and the second preset vehicle speed may be set to any suitable values according to actual situations. For example, the first preset vehicle speed may be 90 km/h, and the second preset vehicle speed may be 60 km/h.

Further, the entire vehicle controller may perform high voltage power-down on the vehicle when the vehicle speed of the vehicle is lower than the safety threshold value. The entire vehicle controller may, for example, transmit a power-down request to a power-on and power-down control module. After receiving the power-down request, the power-on and power-down control module determines whether the current vehicle speed is lower than a safety threshold value. The safety threshold value is a low vehicle speed value, and is a vehicle speed required to ensure that there is no safety risk to the personnel in the vehicle when the vehicle suddenly loses power; for example, the safety threshold value may be about 10 km/h, etc. If the current vehicle speed is not below the safety threshold value, the vehicle is controlled to maintain the current traveling state. If the current vehicle speed is lower than the safety threshold value, a power-down operation is performed, including cutting off the power output and the high-voltage connection, to avoid safety problems caused by the electric leakage of the power system of the entire vehicle.

Further, both the first control strategy and the second control strategy may be performed if both the first insulation resistance value and the second insulation resistance value indicate that the vehicle is in an insulation fault condition. For example, if the first insulation resistance value is less than the first threshold value but not less than the third threshold value, and the second insulation resistance value is less than the second threshold value but not less than the fourth threshold value, the entire vehicle controller may send a first prompt, send a third prompt, and control the vehicle speed of the vehicle to be lower than the first preset vehicle speed. If the first insulation resistance value is less than the first threshold value but not less than the third threshold value, and the second insulation resistance value is less than the fourth threshold value, the entire vehicle controller may send a first prompt, send a fourth prompt, control the vehicle speed of the vehicle to be lower than the second preset vehicle speed, and perform high voltage power-down if the vehicle speed of the vehicle is lower than the safety threshold value. If the first insulation resistance value is less than the third threshold value, and the second insulation resistance value is less than the second threshold value but not less than the fourth threshold value, the entire vehicle controller may send a second prompt, prohibit the fuel cell from starting, control the vehicle speed based on the electric capacity of the lithium battery of the vehicle, send a third prompt, and control the vehicle speed of the vehicle to be lower than the first preset vehicle speed. If the first insulation resistance value is less than the third threshold value, and the second insulation resistance value is less than the fourth threshold value, the entire vehicle controller may send a second prompt, prohibit the fuel cell from starting, control the vehicle speed based on the electric capacity of the lithium battery of the vehicle, send a fourth prompt, control the vehicle speed of the vehicle to be lower than a second preset vehicle speed, and perform high voltage power-down if the vehicle speed of the vehicle is lower than the safety threshold value. In this way, it is convenient for the driver to know that both the inside of the fuel cell and the entire vehicle power system have insulation faults while ensuring the safety of personnel in the vehicle.

Figure 3:
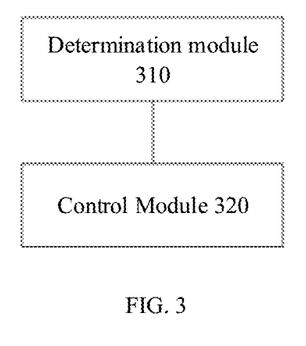
FIG. 3 is a block diagram showing the structure of an insulation detecting apparatus for a fuel cell vehicle according to an embodiment of the present disclosure.

FIG. 3 is a block diagram showing the structure of an insulation detecting apparatus for a fuel cell vehicle according to an embodiment of the present disclosure. As shown in FIG. 3, an embodiment of the present disclosure also provides an insulation detecting apparatus for a fuel cell vehicle. The apparatus may be applied to an entire vehicle controller. The apparatus may include: a determination module 310 for determining whether a vehicle is started; and a control module 320 for performing the following steps in the event that the vehicle is started: controlling a battery management system to perform a first insulation detection; detecting whether the fuel cell is started; and controlling the fuel cell control unit to perform a second insulation detection when the fuel cell is not started, wherein an insulation detection module for performing insulation detection on the fuel cell is provided inside the fuel cell control unit of the vehicle. When the vehicle is started and the fuel cell is not started, both the battery management system and the fuel cell control unit are controlled to perform insulation detection, making it possible to effectively avoid a safety risk due to an insulation fault inside the fuel cell.

In some alternative embodiments, the control module may also be configured to: keep the battery management system performing the first insulation detection when the fuel cell is started.

In some alternative embodiments, the control module may also be configured to: when the fuel cell is started, determine whether the fuel cell is deactivated; and control the fuel cell control unit to perform the second insulation detection when the fuel cell is deactivated.

In some alternative embodiments, the control module may also be configured to: determine whether the fuel cell is started when the fuel cell is not started; and control the fuel cell control unit to stop performing the second insulation detection when the fuel cell is started.

The insulation detecting apparatus for fuel cell vehicles provided by an embodiment of the present disclosure cooperates with the fuel cell control unit by the battery management system so that vehicle driving, when each part is in an insulation condition, is in a monitored state at any time, thereby effectively avoiding a safety hazard caused by the insulation fault inside the fuel cell not being detected.

The specific working principles and benefits of the insulation detecting apparatus for a fuel cell vehicle provided by the embodiments of the present disclosure are the same as those of the insulation detection method for a fuel cell vehicle provided by the embodiments of the present disclosure described above, and will not be described in detail herein.

Correspondingly, an embodiment of the present disclosure also provides a vehicle, which may be a fuel cell vehicle and may include the insulation detecting apparatus for a fuel cell vehicle according to any of the embodiments of the present disclosure.

Correspondingly, embodiments of the present disclosure also provide a computer-readable storage medium including a memory having stored thereon instructions for enabling a machine to perform the insulation detection method for a fuel cell vehicle according to any of the embodiments of the present disclosure. Wherein the computer-readable storage medium includes, but is not limited to, phase-change random access memory (PRAM), static random access memory (SRAM), dynamic random access memory (DRAM), other types of random access memory (RAM), read-only memory (ROM), electrically erasable programmable read-only memory (EEPROM), flash memory (Flash Memory) or other memory technologies, compact disc read-only memory (CD-ROM), digital versatile disc (DVD) or other optical storage, magnetic cassettes, tape and disk storage, or other magnetic storage devices, and like various media that can store program codes.

The embodiments of the apparatus described above are merely schematic, wherein the units illustrated as separate parts may or may not be physically separated, and the parts shown as units may or may not be physical units, i.e., they may be located in one place, or may also be distributed over a plurality of network units. Some or all of the modules may be selected to achieve the objects of the embodiment schemes according to actual needs. A person of ordinary skills in the art could understand and implement the present disclosure without involving any inventive efforts.

Various part embodiments of the present disclosure may be implemented in hardware, or in a software module traveling on one or more processors, or in a combination thereof. Those skilled in the art will appreciate that a microprocessor or digital signal processor (DSP) may be used in practice to implement some or all of the functions of some or all of the parts of a computing processing device according to the embodiments of the present disclosure. The present disclosure may also be embodied as a device or an apparatus program (e.g., a computer program and a computer program product) for performing a portion or all of the methods described herein. Such a program implementing the present disclosure may be stored on a computer-readable medium or may be in the form of one or more signals. Such signals may be downloaded from an Internet website, provided on a carrier signal, or provided in any other form.

Figure 4:
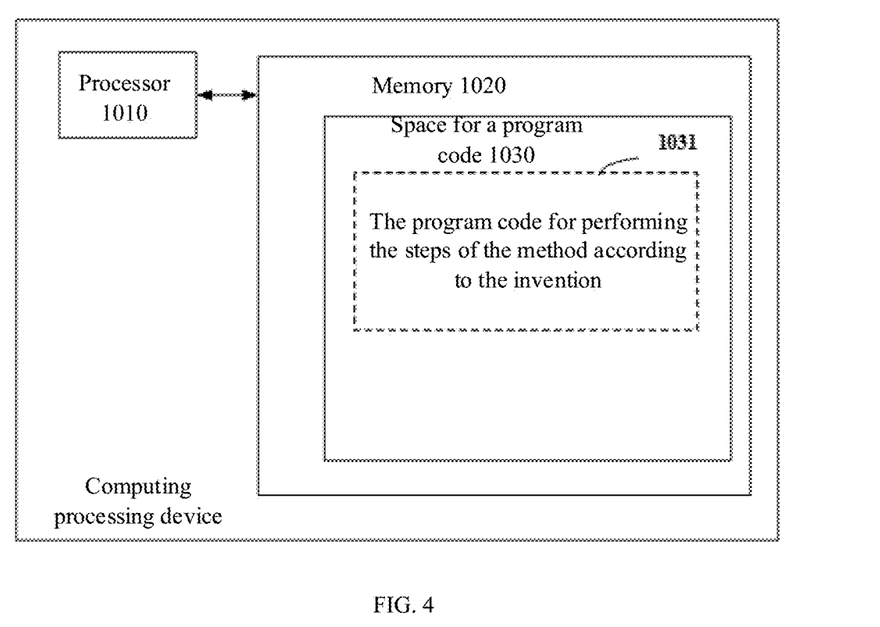
FIG. 4 schematically shows a block diagram of a computing processing device for performing a method according to the present disclosure.
Figure 5:
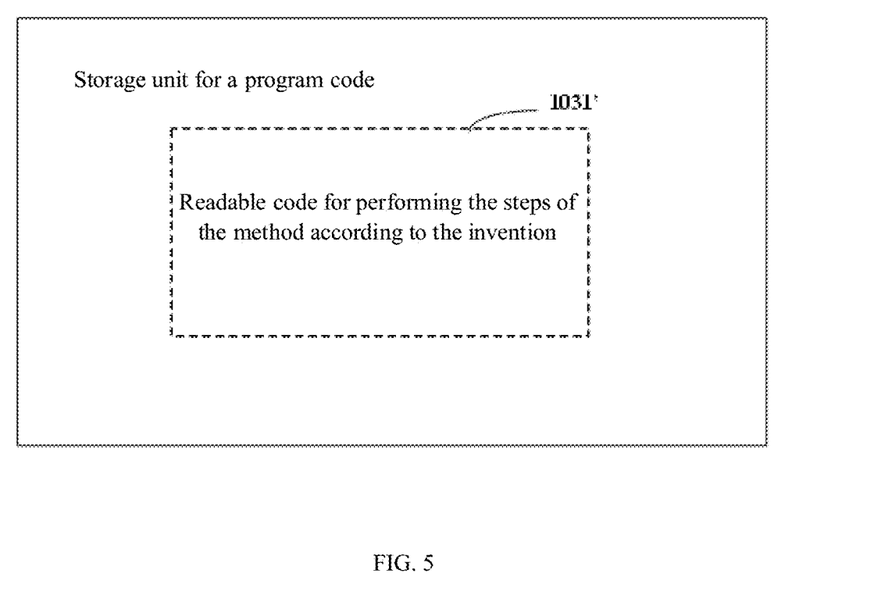
FIG. 5 schematically shows a storage unit for holding or carrying a program code for implementing the method according to the present disclosure.

For example, FIG. 4 shows a computing processing device that may implement a method according to the present disclosure. The computing processing device conventionally includes a processor 1010 and a computer program product or computer-readable medium in the form of a memory 1020. The memory 1020 may be an electronic memory such as flash memory, EEPROM (electrically erasable programmable read only memory), EPROM, hard disk, or ROM. The memory 1020 has a storage space 1030 for a program code 1031 for performing any of the method steps of the above method. For example, the storage space 1030 for the program code may include each program code 1031 for implementing various steps in the above method, respectively. The program codes may be read from or written into one or more computer program products. These computer program products comprise a program code carrier such as a hard disk, a compact disc (CD), a memory card, or a floppy disk. Such a computer program product is usually a portable or fixed storage unit as described with reference to FIG. 5. The storage unit may have storage segments, storage space, etc. arranged similarly to the memory 1020 in the computing processing device of FIG. 4. The program code may, for example, be compressed in a suitable form. Generally, the storage unit includes a computer-readable code 1031', i.e., a code that can be read by a processor, such as, for example, 1010. These codes, when run by a computing processing device, cause the computing processing device to perform the various steps in the method described above.

Reference herein to "one embodiment", "an embodiment", or "one or more embodiments" means that a particular feature, structure, or characteristic described in connection with the embodiment is included in at least one embodiment of the present disclosure. In addition, please note that instances of the phrase "in one embodiment" herein are not necessarily all referring to the same embodiment.

In the description provided herein, numerous specific details are set forth. However, it could be understood that embodiments of the disclosure may be practiced without these specific details. In some instances, well-known methods, structures and techniques have not been shown in detail in order not to obscure the understanding of this description.

In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosure can be implemented by means of hardware comprising several distinct elements, and by means of a suitably programmed computer.

In the unit claims enumerating several apparatuses, several of these apparatuses can be specifically embodied by one and the same item of hardware. The use of the words first, second, third, etc. does not denote any order. These words may be interpreted as names.

The above descriptions are only preferred embodiments of the present disclosure, and are not intended to limit the present disclosure. Any modifications, equivalent replacements, improvements, etc. made within the spirit and principles of the present disclosure shall be included in the scope of the present disclosure.

The invention claimed is:

1. An insulation detection method for a fuel cell vehicle, comprising:
   by one or more processors, determining whether a vehicle is started;
   and when the vehicle is started, by one or more processors, performing following steps:
   controlling a battery management system to perform a first insulation detection, wherein the first insulation detection is an insulation detection performed on a high voltage network of the vehicle;
   detecting whether a fuel cell is started; and
   when the fuel cell is not started, controlling a fuel cell control unit to perform a second insulation detection, wherein the second insulation detection is an insulation detection performed on the fuel cell, and an insulation detection module for performing insulation detection on the fuel cell is provided in the fuel cell control unit of the vehicle.

2. The insulation detection method for the fuel cell vehicle according to claim 1, wherein the method further comprises:
   when the fuel cell is started, keep performing the first insulation detection by the battery management system.

3. The insulation detection method for the fuel cell vehicle according to claim 2, wherein the method further comprises:
   when the fuel cell is started, determining whether the fuel cell is deactivated; and
   controlling the fuel cell control unit to perform the second insulation detection when the fuel cell is deactivated.

4. The insulation detection method for the fuel cell vehicle according to claim 1, wherein the method further comprises:
   when the fuel cell is not started, determining whether the fuel cell is started; and
   when the fuel cell is started, controlling the fuel cell control unit to stop performing the second insulation detection.

5. An insulation detecting apparatus for a fuel cell vehicle, comprising:
   one or more processors and a storage apparatus; and
   wherein the storage apparatus stores a computer program which, when executed by the processor, performs operations, comprising:
   determining whether the vehicle is started;
   performing following steps when the vehicle is started:
   controlling a battery management system to perform a first insulation detection, wherein the first insulation detection is an insulation detection performed on a high voltage network of an entire vehicle;
   detecting whether a fuel cell is started; and
   when the fuel cell is not started, controlling a fuel cell control unit to perform a second insulation detection, wherein the second insulation detection is an insulation detection performed on the fuel cell, and an insulation detection module for performing insulation detection on the fuel cell is provided in the fuel cell control unit of the vehicle.

6. The insulation detecting apparatus for the fuel cell vehicle according to claim 5, wherein when the vehicle is started, the operations further comprise:
when the fuel cell is started, keep performing the first insulation detection by the battery management system.

7. The insulation detecting apparatus for the fuel cell vehicle according to claim 6, wherein when the vehicle is started, the operations further comprise:
when the fuel cell is started, determining whether the fuel cell is deactivated; and
controlling the fuel cell control unit to perform the second insulation detection when the fuel cell is deactivated.

8. The insulation detecting apparatus for the fuel cell vehicle according to claim 5, wherein when the vehicle is started, the operations further comprise:
when the fuel cell is not started, determining whether the fuel cell is started; and
when the fuel cell is started, controlling the fuel cell control unit to stop performing the second insulation detection.

9. A vehicle, wherein the vehicle comprises the insulation detecting apparatus for the fuel cell vehicle according to claim 5.

10. A non-transitory computer-readable storage medium, having instructions stored thereon for causing a computer to perform the insulation detection method for the fuel cell vehicle according to claim 1.

11. A computing processing device, comprising:
a memory storing a computer-readable code; and
one or more processors, wherein when the computer-readable code is performed by the one or more processors, the computing processing device performs an insulation detection method for a fuel cell vehicle, wherein the insulation detection method for a fuel cell vehicle comprises:
determining whether a vehicle is started;
and when the vehicle is started, performing following steps:
controlling a battery management system to perform a first insulation detection, wherein the first insulation detection is an insulation detection performed on a high voltage network of the vehicle;
detecting whether a fuel cell is started; and
when the fuel cell is not started, controlling a fuel cell control unit to perform a second insulation detection, wherein the second insulation detection is an insulation detection performed on the fuel cell, and an insulation detection module for performing insulation detection on the fuel cell is provided in the fuel cell control unit of the vehicle.

12. The computing processing device according to claim 11, wherein the method further comprises:
when the fuel cell is started, keep performing the first insulation detection by the battery management system.

13. The computing processing device according to claim 11, wherein the method further comprises:
when the fuel cell is not started, determining whether the fuel cell is started; and
when the fuel cell is started, controlling the fuel cell control unit to stop performing the second insulation detection.

14. The computing processing device according to claim 12, wherein the method further comprises:
when the fuel cell is started, determining whether the fuel cell is deactivated; and
controlling the fuel cell control unit to perform the second insulation detection when the fuel cell is deactivated.

* * * * *